United States Patent [19]

Heywang

[11] 4,164,811

[45] Aug. 21, 1979

[54] PROCESS FOR MAKING A SEMICONDUCTOR COMPONENT WITH ELECTRICAL CONTACTS

[75] Inventor: Walter Heywang, Neukeferloh, Fed. Rep. of Germany

[73] Assignee: Siemens Aktiengesellschaft, Berlin & Munich, Fed. Rep. of Germany

[21] Appl. No.: 771,848

[22] Filed: Feb. 25, 1977

[30] Foreign Application Priority Data

Mar. 12, 1976 [DE] Fed. Rep. of Germany ....... 2610539

[51] Int. Cl.² ............................................. H05K 3/00
[52] U.S. Cl. ...................................... 29/628; 29/588; 29/589; 29/590
[58] Field of Search ................. 29/626, 627, 628, 588, 29/589, 590, 591, 25.42

[56] References Cited

U.S. PATENT DOCUMENTS

| | | | |
|---|---|---|---|
| 2,977,672 | 4/1961 | Telfer | 29/628 X |
| 2,990,498 | 6/1961 | Evans | 29/626 |
| 3,213,404 | 10/1965 | Hedstrom | 29/626 X |
| 3,300,851 | 1/1967 | Lodder | 29/626 |
| 3,368,276 | 2/1968 | Renskers | 29/626 X |
| 3,390,252 | 6/1968 | Storck | 29/626 |
| 3,418,444 | 12/1968 | Ruehlemann | 29/628 |
| 4,012,833 | 3/1977 | Akiyama | 29/626 X |
| 4,024,627 | 5/1977 | Stauffer | 29/588 |
| 4,079,284 | 3/1978 | Fanshawe | 29/626 X |

Primary Examiner—C. W. Lanham
Assistant Examiner—C. J. Arbes
Attorney, Agent, or Firm—Hill, Van Santen, Steadman, Chiara & Simpson

[57] ABSTRACT

A semiconductor component with electric contacts is formed which includes a semiconductor body having metal contact layers formed in ohmic contact with at least two side surfaces thereof. In the process of making the component, a layer sequence is made including two layers formed of thermoplastic material and an intermediate layer of conductive material sandwiched between the two thermoplastic layers. In the process the temperature of the semiconductor body is raised to soften the thermoplastic material and the semiconductor body with its metal contacts is pressed through one of the thermoplastic layers, through the intermediate conductive layer to rupture the same and divide it into two parts and partially into the other thermoplastic layer. The intermediate layer is now composed of two parts, each part being conductively in contact with one of the metal contacts on the side surfaces of the semiconductor body. By forcing the semiconductor body and the leads through one of the thermoplastic layers into a desired position in the other thermoplastic layer, the first thermoplastic layer referred to, when cooled, partially extends upwardly against the respective faces of the semiconductor body to firmly grip these parts in place against the other thermoplastic layer.

Furthermore, the metal contacts on the semiconductor body become fused to the two parts respectively of the intermediate conductive layer. Lead wires to the intermediate conductive parts are provided by pressing them through the first mentioned thermoplastic layer into contact with the intermediate conductive parts and fused therewith.

7 Claims, 5 Drawing Figures

PROCESS FOR MAKING A SEMICONDUCTOR COMPONENT WITH ELECTRICAL CONTACTS

FIELD OF THE INVENTION

The invention relates to a semiconductor component with electric contacts and to a process for the production of such electric contacts.

BACKGROUND OF THE INVENTION

In semiconductor technology, the problem frequently occurs that particularly small-area electric contacts must be applied to semiconductor components which themselves are very small, and without a large technical outlay. Known processes for the production of such contacts are for example "nail-head bonding", in which a small wire is secured to the particular surface of a semiconductor component which is to be contacted by means of thermo-compression. A disadvantage of this process consists in the fact that each contact must be individually produced and where the semiconductor components are very small, an exact hit on the contacting point is difficult.

Other processes for the production of contacts on semiconductor components are, for example, remelting-soldering n which the semiconductor component is provided with bumps on the contacting surfaces and in which these bumps are placed onto correspondingly shaped bumps located on supply lines and are fused to one another. Furthermore, semiconductor components can be contacted by a so-called "beam lead" process in which conductor paths are galvanically deposited on the semiconductor surface. The two last processes have the disadvantage that following the application of the first metal contact layer to the semiconductor body, further process steps are required in which the semiconductor body is treated with galvanic baths and is then finally cleansed.

RELATED APPLICATIONS

The present invention is an improvement over what is described in application, Ser. No. 398,863, now U.S. Pat. No. 3,913,224, assigned to the same assignee as the present invention. This patent describes a method of providing electrical components in which a thermoplastic carrier foil supports one or more electrically conductive layers with insulating and/or dielectric layers between the conductive layers. In the method, an electrically conductive layer or layers are applied to a carrier foil, and the electrically conductive layer is provided with at least one contacting area for receiving a contacting wire.

The present invention also is an improvement over what is described in application Ser. No. 398,864, now U.S. Pat. No. 3,857,074, which is assigned to the same assignee as the present invention. This patent discloses an electrical capacitor and a process for making the same. This patent discloses in part the method of forcing lead conductors through one or more layers of thermoplastic material into contact with a metallic layer which forms a plate of the capacitor.

SUMMARY OF THE PRESENT INVENTION

It is an object of the present invention to provide a construction for semiconductor components with electric contacts which permits even very small semiconductor components in a reliable and mechanically stable manner and which at the same time is accomplished by only a few process steps for its production.

The aforedescribed process which causes a thermoplastic foil to be applied to the surface to be contacted and then having a connection wire fused through this foil and secured to the metallization surface to be contacted can not be applied to the contacting of semiconductor components without additional means, since it is very difficult to hit the very small contacting surface of the semiconductor component with the connection wire through the carrier foil. The present invention is best exemplified by describing the structure as being a semiconductor diode. Metal contacts in the form of metal layers are formed on surfaces of the semiconductor body which are on opposite sides of the pn junction. It is advantageous if the metal contact layers possess small bumps or corrugations, for a reason which will later be apparent.

A layer sequence is provided including two layers of thermoplastic material and an intermediate layer of conductive material sandwiched between the two thermoplastic layers. The intermediate layer is divided, each part being conductively in contact with one of the contact layers of the semiconductor body. The contact layers are at least partially embedded in one of the thermoplastic layers and at least partially extend through the other of said thermoplastic layers. The semiconductor body is mounted in the layer sequence by raising the temperature of the semiconductor body to a point where, when it is forced against the layer sequence, it softens the thermoplastic material to a point where the semiconductor body can be forced through one of the thermoplastic layers and partially into the other thermoplastic layer with the metal layers of the semiconductor body being fused to the intermediate layers of conductive material. When the conductive metal contact layers on the semiconductor body are provided with bumps, such as knobs or corrugations, better contact is provided with the intermediate conductive layers. In one form of the invention, the conductive intermediate layers are provided by starting originally with a single intermediate layer which is ruptured when the semiconductor component is pressed through one thermoplastic layer of the layer sequence and through the intermediate layer of conductive material, partially into the other thermoplastic layer of the layer sequence. One form of diode which can be formed by the present invention has its metal contact layers applied on surfaces of the semiconductor body which are at a corner thereof. To avoid short-circuiting the pn junction adjacent this corner, a layer of insulating material is formed over the pn junction so that the layer of conductive material in the layer sequence does not contact the semiconductor body at the surface line of the pn junction.

BRIEF DESCRIPTION OF THE DRAWINGS

The manner in which, in accordance with the invention, a semiconductor component with electric contacts is constructed and is produced will be described in detail in the following and explained by making reference to the Figures, in which.

DESCRIPTION OF THE PREFERRED EMBODIMENTS

Figure 1:
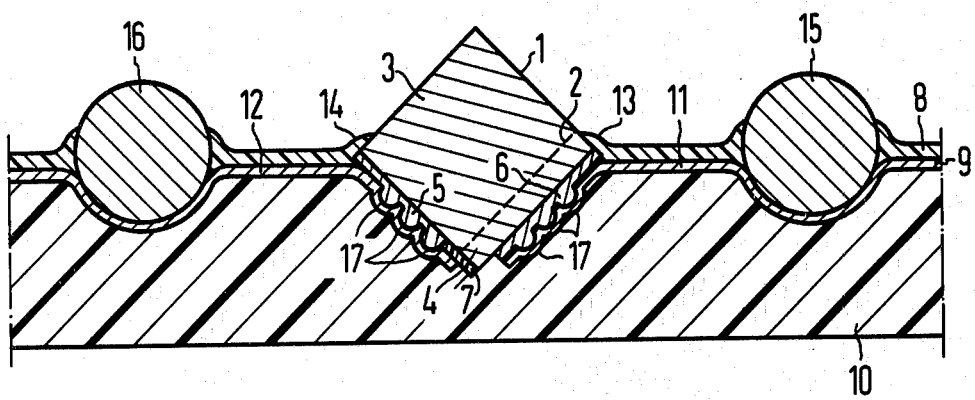
FIGS. 1 and 2 schematically illustrate how a semiconductor component is impressed into the layer sequence of two thermoplastic carrier foils and the intermediate layer of conductive material and how further connection wires are applied.

The contacting of a luminescence diode will serve as an example. A semiconductor body 1, through which runs a pn-junction layer 2, is provided with a metal contact layer 5 on the side surface of its p-conducting part, and is provided with a metal contact layer 6 on the side surface of its n-conducting part 4. These metal contact layers are designed to be such that they possess small bumps 17. The material used can, for example, be gold. The metal contact layers 5 and 6 are applied in such a manner that the pn-junction is not bridged. To prevent the pn-junction from becoming conductively bridged on the impression of the semiconductor body 1 into the layer sequence of thermoplastic layers 8 and 10 and the intermediate layer 9 of conductive material, that part of the surface of the semiconductor body at which the pn-junction emerges, is covered with an insulating layer 7. Then the semiconductor body, which has been provided in this way with the metal contact layers 5 and 6 and with the insulating layer 7 is pressed into the layer sequence composed of a thermoplastic layer 8, an underlying conductive intermediate layer 9 and a layer 10 located beneath this layer 9 and consisting of thermoplastic material. Prior to the impression, the semiconductor body is heated to a temperature above the softening temperature of the thermoplastic material. The impression is preferably effected with the aid of a thermostatized ram. The semiconductor body 1 is pressed into the thermoplastic material 10 to such a depth that the intermediate layer 9 consisting of conductive material opens up (i.e., ruptures) and in this way two separate sub-zones 11, 12 of this conductive layer are formed. On the impression of the semiconductor body, thermoplastic material of the layer 8 swells upwards somewhat at the positions 13 and 14, as a result of which, after the thermoplastic material has solidified, a mechanically stable support is formed for the semiconductor body, surrounding the latter. The sub-zones or parts 11 and 12, into which the layer 9 of conductive material has been torn open, are likewise provided with outer terminals by pressing heated connection wires 15 and 16 in accordance with the method described in U.S. Pat. No. 3,857,074.

Figure 2:
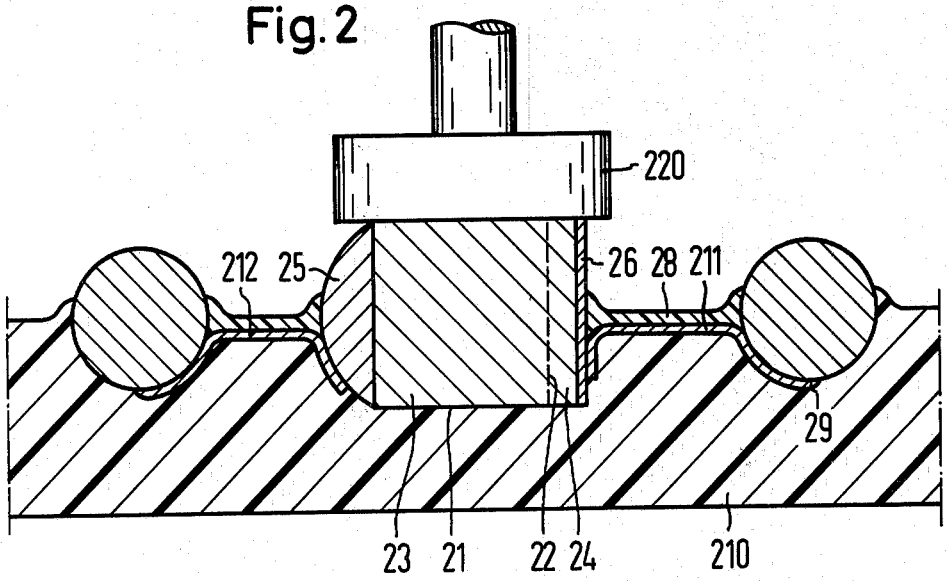

FIG. 2 illustrates another way by which a semiconductor component, e.g., a luminescence diode can be contacted. The semiconductor body 21, which consists of a p-conducting component 23 and an n-conducting component 24 with a pn-junction 22 is provided with metal contact layers 25 and 26 consisting of gold on the side surfaces which run parallel to the pn-junction layer 22, for example, by vapor deposition. To compensate unreliability in the precise positioning of the semiconductor body 21 during the impression into the thermoplastic material, the metal contact layer 25 is designed to be bumpy. The semiconductor body is now pressed into a layer sequence composed of the layers 28, 29 and 210 following a preceding heating to a temperature above the softening point of the thermoplastic material with a thermostatized ram 220. In the layer sequence, the layer 29 of conductive material is composed of two parallel strips 211 and 212 which are separate from one another and consist of a metal, e.g., aluminum. These separate strips can be produced in that in a layer sequence comprising an initially cohesive layer 29 of conductive material, a strip is milled out to such a depth that this layer 29 is broken. Such a strip can also be freed by irradiation and heating with a laser beam (laser erosion) from the conductive layer instead of mechanical removal. The semiconductor component is then accurately impressed into this milled-out part. In comparison to the process described with reference to FIG. 1, this process has the advantage that no danger exists that the pn-junction 22 will be conductive bridged by parts of the layer 29 which are drawn along during the impression of the semiconductor component, so that it is unnecessary to cover the pn-junction 22 with an insulating layer applied to the semiconductor body, as is effected in the process illustrated in FIG. 1, with the aid of the insulating layer 7. The application of the connection wires to the layer 29 of conductive material is effected in the manner known from the U.S. Pat. No. 3,857,074. Following the contacting of the semiconductor body and the application of connection wires, the component can be cast into a synthetic material for further protection from mechanical strain.

Figure 3:
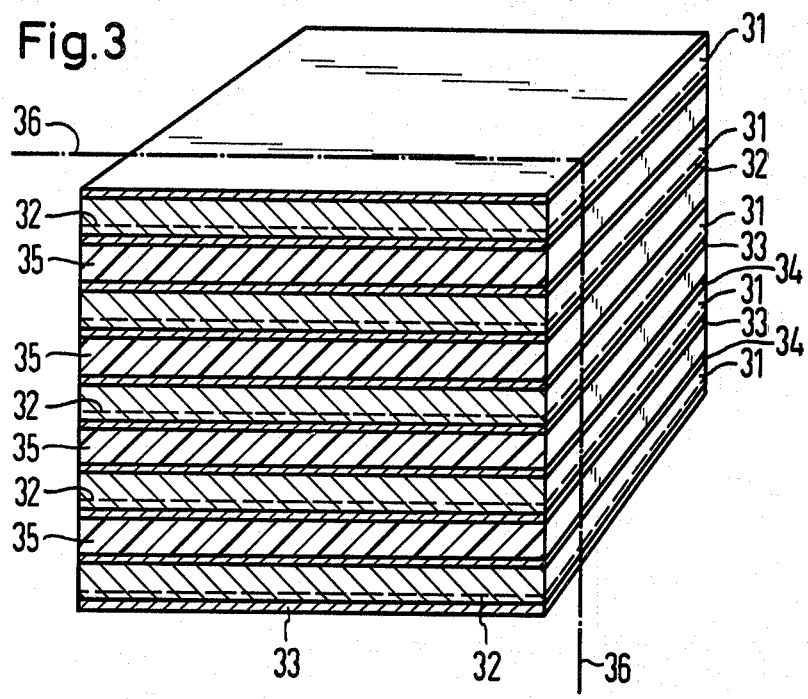
FIGS. 3 and 4 show how the semiconductor component illustrated in FIGS. 1 and 2 is expediently produced.
Figure 4:
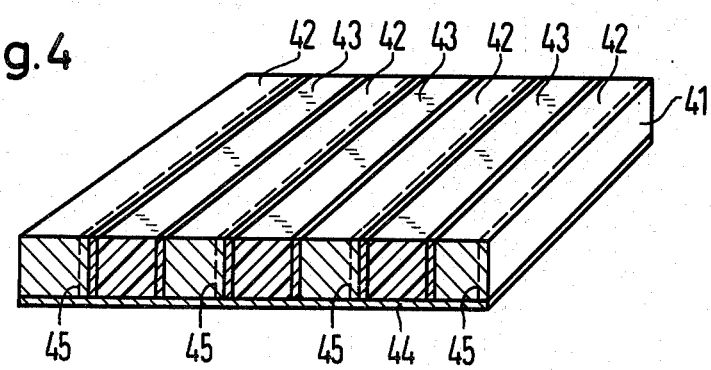
Figure 5:
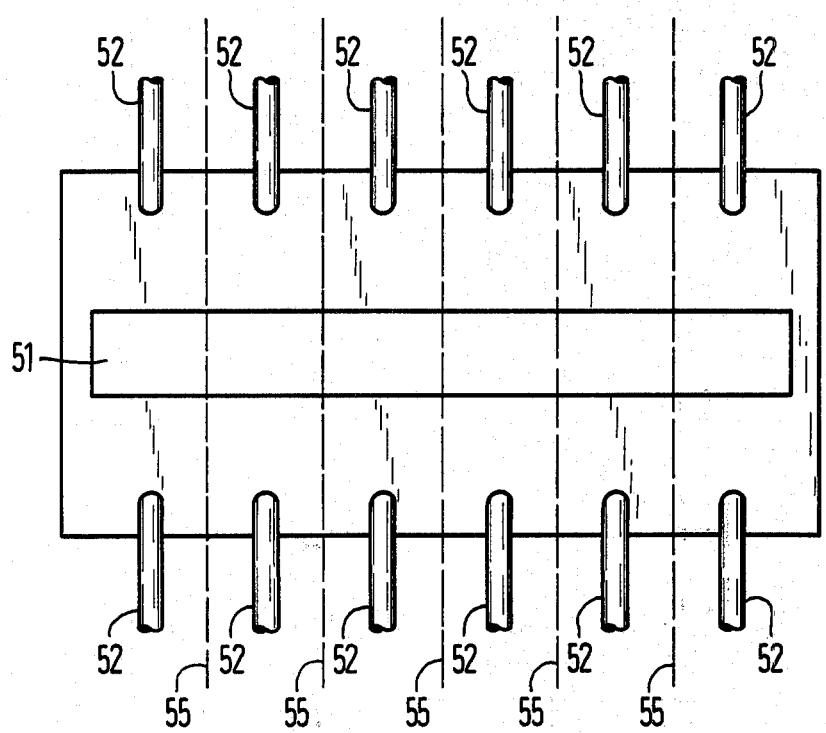
FIG. 5 is a plan view of a semiconductor body provided with connection wires.

In semiconductor components which, in accordance with FIG. 1, are provided with ain insulating layer (7 in FIG. 1) which serves to protect a pn-junction, the metal contact layers and the insulating layers are advantageously applied in the manner illustrated in FIGS. 3 and 4. The semiconductor wafers 31, in which pn-junctions 32 run parallel to the surface of these wafers are provided on their surface and their base with a layer 33, 34 of metal, e.g., gold. This metal is, for example, vapor deposited or sputter deposited. These semiconductor wafers 31 are then stacked one upon another with the aid of a synthetic intermediate layer 35. Here each semiconductor wafer is separated from the next semiconductor wafer by a synthetic intermediate layer 35 of this type. This synthetic intermediate layer consists of a soluble material. Then from the block formed in this way of semiconductor wafers with interlayers of synthetic material, wafers are cut off in a plane 36 which is perpendicular to the plane of the pn-junctions. A wafer having been cut in this way is schematically illustrated in FIG. 4. To this wafer 41, which consists of a plurality of semiconductor rods 42 with interlying synthetic rods 43, an insulating layer 44 is applied in such a manner that the pn-junctions 45 which emerge on the surface of the wafer 41 are covered by this insulating layer. The application of the insulating layer can here take place in such a manner that in each case only that part in which the pn-junctions 45 appear at the surface of the semiconductor rods 42 is covered or it can be applied to the whole surface over the entire wafer consisting of individual rods. Then the synthetic intermediate layers 43 are dissolved away so that individual semiconductor rods provided with metal contact layers and insulating layers remain. The semiconductor rods are then contacted with an intermediate layer composed of electrically conductive material by being impressed into a layer sequence consisting of thermoplastic material as already described with reference to FIGS. 1 and 2. Then connection wires 52 are applied in a known manner along the semiconductor rod 51; in order to achieve a mechanically stable hold, the semiconductor rod is then cast into synthetic material, and finally sawed into individual components in a direction perpendicular to the rod direction (lines 55 in FIG. 5), in such a manner that each of the sawed-off components in each case possess two connection wires 52 (FIG. 5). This entire process ensures that the contacting is carried out on a relatively large semiconductor body and the very small, individual components are merely sawed off from an already completed larger body provided with terminals.

It will be apparent to those skilled in the art that many modifications and variations may be effected without departing from the spirit and scope of the novel concepts of the present invention.

I claim:

1. A process for the production of a semiconductor component with electric contacts in which a layer sequence composed of upper and lower layers of thermoplastic material is formed with an intermediate layer of conductive material between said upper and lower layers, taking a semiconductor body having at least two sides with metal contact layers, respectively, on each of two sides, raising the temperature of the semiconductor body to a point which will soften the thermoplastic material, forcing said semiconductor body with its metal contact layers through one of said thermoplastic layers and into a portion of the other of said thermoplastic layers leaving said layer of conductive material divided into two intermediate layer parts being in direct electrical contact respectively with said metal contact layers of said semiconductor body, and forcing further electric supply lines through one of said thermoplastic layers into electric contact with said intermediate conductive layer.

2. A process as claimed in claim 1, in which the semiconductor body is forced through said one of said thermoplastic layers and into a portion of the other of said thermoplastic layers by means of a thermostatically controlled ram.

3. A process as claimed in claim 1, in which the semiconductor body is pressed through the intermediate layer of conductive material in a manner to cause the latter to be torn open into two parts which are separate from one another, and wherein the said two parts are conductively connected to the metal contact layers, respectively, located on the semiconductor component.

4. A process as claimed in claim 1, in which the layer sequence consists of two layers of thermoplastic material with an intermediate conductive layer therebetween, which intermediate conductive layer is ruptured when the semiconductor body is forced through the said one of said thermoplastic layers to thereby separate the intermediate conductive layer into two parts.

5. A process as claimed in claim 1, in which two connection wires are heated and pressed into the thermoplastic layer which is the layer through which the semiconductor body has been forced, in such a manner that one of said wires is conductively connected to one of said intermediate layer parts, and the other of said wires is connected to the other of said intermediate layer parts.

6. A process as claimed in claim 4, in which the semiconductor body is rod-shaped and is pressed into the layer sequence in such a manner that two of its longitudinal sides are, in each case, conductively connected to one of said intermediate layer parts, respectively, and that thereafter pairs of connection wires are applied along the axial direction of the rod-shaped semiconductor body and then the semiconductor body is cut up perpendicular to its axial direction in such a manner that the parts of the semiconductor body which are thereby formed each possess a pair of connection wires.

7. A process as claimed in claim 6, wherein the intermediate layer of conductive material consist of two separate parts, and wherein the semiconductor body is pressed in the spacing between said separate parts in such a manner, that one contact layer of the semiconductor body is conductively connected with one part of said intermediate layer and the other contact layer of the semiconductor body is conductively connected with the other part of said intermediate layer.

* * * * *